US010629385B2

(12) United States Patent
Coridan et al.

(10) Patent No.: US 10,629,385 B2
(45) Date of Patent: Apr. 21, 2020

(54) HIERARCHICALLY NANOSTRUCTURED FILMS AND APPLICATIONS THEREOF

(71) Applicant: The Board of Trustees of the University of Arkansas, Little Rock, AR (US)

(72) Inventors: Robert H. Coridan, Fayetteville, AR (US); Mya A. Norman, Springdale, AR (US); Walker Perez, Fayetteville, AR (US)

(73) Assignee: The Board of Trustees of The University of Arkansas, Little Rock, AR (US)

( * ) Notice: Subject to any disclaimer, the term of this patent is extended or adjusted under 35 U.S.C. 154(b) by 0 days.

(21) Appl. No.: 16/043,730

(22) Filed: Jul. 24, 2018

(65) Prior Publication Data

US 2019/0027315 A1 Jan. 24, 2019

Related U.S. Application Data

(60) Provisional application No. 62/536,236, filed on Jul. 24, 2017.

(51) Int. Cl.
| | |
|---|---|
| *H01G 9/20* | (2006.01) |
| *H01L 31/0224* | (2006.01) |
| *H01G 9/048* | (2006.01) |
| *B82Y 30/00* | (2011.01) |

(Continued)

(52) U.S. Cl.
CPC ............. *H01G 9/204* (2013.01); *H01G 9/048* (2013.01); *H01G 9/2027* (2013.01); *H01G 9/2036* (2013.01); *H01L 31/022475* (2013.01); *H01L 31/022483* (2013.01); *B82Y 30/00* (2013.01); *B82Y 40/00* (2013.01); *H01L 31/0284* (2013.01)

(58) Field of Classification Search
CPC ...... H01G 9/204; H01G 9/048; H01G 9/2027; H01G 9/2036; H01L 31/022475; H01L 31/022483
See application file for complete search history.

(56) References Cited

U.S. PATENT DOCUMENTS

| | | | |
|---|---|---|---|
| 6,423,404 B1 * | 7/2002 | Ohtsuka | C03C 17/007 428/328 |
| 2002/0037398 A1 * | 3/2002 | Tofuku | B32B 27/18 428/325 |
| 2015/0333307 A1 * | 11/2015 | Thokchom | H01M 2/145 429/144 |

OTHER PUBLICATIONS

Wu et al., A transparent electrode based on a metal nanotrough network, Nature, Nanotechnology, pp. 1-5 (Year: 2013).*

(Continued)

*Primary Examiner* — Jayne L Mershon
(74) *Attorney, Agent, or Firm* — J. Clinton Wimbish; Nexsen Pruet, PLLC

(57) ABSTRACT

In one aspect, nanostructured films are described herein comprising controlled architectures on multiple length scales (e.g. ≥3). As described further herein, the ability to control film properties on multiple length scales enables tailoring structures of the films to specific applications including, but not limited to, optoelectronic, catalytic and photoelectrochemical cell applications. In some embodiments, a nanostructured film comprises a porous inorganic scaffold comprising particles of an electrically insulating inorganic oxide. An electrically conductive metal oxide coating is adhered to the porous inorganic scaffold, wherein the conductive metal oxide coating binds adjacent particles of the insulating inorganic oxide.

15 Claims, 11 Drawing Sheets

(51) Int. Cl.
*B82Y 40/00* (2011.01)
*H01L 31/028* (2006.01)

(56) References Cited

OTHER PUBLICATIONS

Luna-Vera et al., Electroassisted Fabrication of Free-Standing Silica Structures of Micrometer Size, American Chemical Society, Chemistry of Materials, vol./Issue 24, pp. 2265-2273 (Year: 2012).*

* cited by examiner

|              | As prepared | After 10min sonication in Toluene | though
HIERARCHICALLY NANOSTRUCTURED FILMS AND APPLICATIONS THEREOF

RELATED APPLICATION DATA

The present application claims priority pursuant to 35 U.S.C. § 119(e) to U.S. Provisional Patent Application Ser. No. 62/536,236 filed Jul. 24, 2017, which is incorporated herein by reference in its entirety.

FIELD

The present invention relates to thin films and, in particular, to hierarchically nanostructured thin films and applications thereof.

BACKGROUND

Thin films are employed in a variety of fields, including photovoltaics, electronics and advanced coatings for providing resistance to corrosive and/or high wear environments. Accordingly, thin film structure and properties vary according to specific application. In many cases, thin film structure is a balance of multiple properties. For example, electrode thin films of photoelectrochemical cells (PEC) are required to exhibit sufficient light absorption, carrier collection and desirable mass transport properties of reactants. Developing thin film architectures meeting these requirements can be difficult and expensive to fabricate. Expensive materials are often used in conjunction with time consuming techniques, such as photolithographic methods, dry reactive etching and physical vapor deposition (PVD) of metals. Such fabrication requirements are often not scalable and are cost prohibitive at the commercial level.

SUMMARY

In one aspect, nanostructured films are described herein comprising controlled architectures on multiple length scales (e.g. ≥3). As described further herein, the ability to control film properties on multiple length scales enables tailoring structures of the films to specific applications including, but not limited to, optoelectronic, catalytic and PEC applications. In some embodiments, a nanostructured film comprises a porous inorganic scaffold comprising particles of electrically insulating inorganic oxide. An electrically conductive metal oxide coating is adhered to the porous inorganic scaffold, wherein the conductive metal oxide coating binds adjacent particles of the insulating inorganic oxide. In some embodiments, the conductive metal oxide coating is radiation transmissive or transparent. As described further herein, a photosensitive layer can be deposited on the conductive metal oxide coating.

In another aspect, photoelectrochemical cells are provided. A photoelectrochemical cell comprises a photoelectrode comprising a nanostructured film, the nanostructured film comprising a porous inorganic scaffold including particles of insulating inorganic oxide. An electrically conductive metal oxide coating is adhered to the porous inorganic scaffold, wherein the conductive metal oxide coating binds adjacent particles of the insulating inorganic oxide. A photosensitive layer is deposited on the conductive metal oxide coating.

In a further aspect, methods of forming nanostructured layers are described herein. A method of forming a nanostructured layer comprises providing a mixture of colloidal polymeric particles and colloidal, electrically insulating inorganic oxide particles and depositing an electrically conductive metal oxide coating on the insulating inorganic oxide particles. The colloidal polymeric particles are removed to provide a porous inorganic scaffold comprising the insulating inorganic oxide particles bound together by the conductive metal oxide coating. In some embodiments, a photosensitive layer is deposited on the conductive metal oxide coating.

These and other embodiments are further described in the following detailed description.

BRIEF DESCRIPTION OF THE DRAWINGS

FIG. 4B—A film exposed to 50c of ALD-ZnO as prepared and after 10 minutes of sonication in toluene.

FIG. 4C—A film exposed to 50c of ALD-ZnO and annealed at 600° C. for one hour as prepared and after 10 minutes of sonication in toluene.

DETAILED DESCRIPTION

Figure 1A:
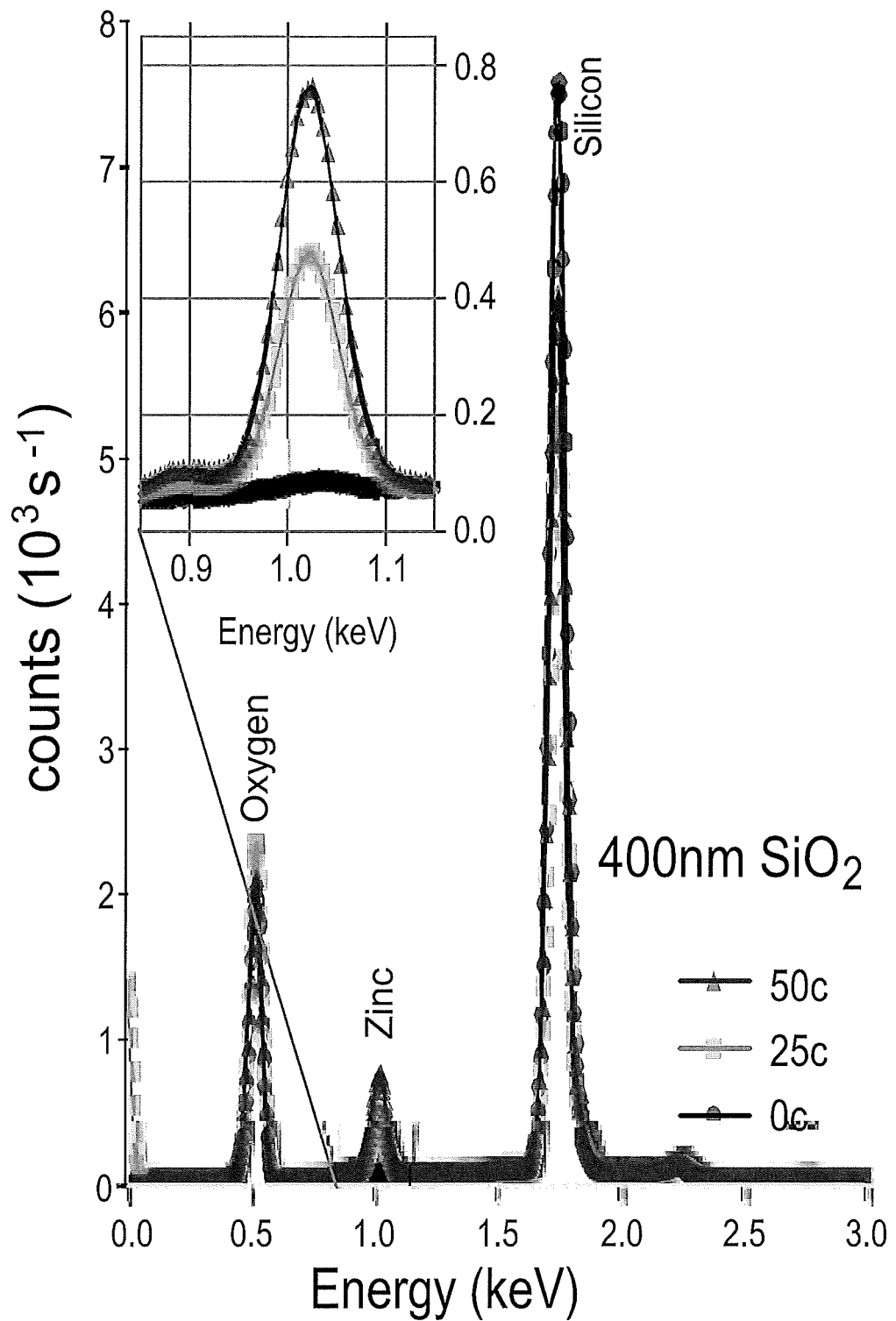
FIG. 1A—EDX spectra of 0c, 25c, and 50c ALD-ZnO films prepared on thin films of close-packed, 400 nm $SiO_2$ nanospheres, with a magnified view of the Zn peak (inset).

Embodiments described herein can be understood more readily by reference to the following detailed description and examples and their previous and following descriptions. Elements and apparatus described herein, however, are not limited to the specific embodiments presented in the detailed description. It should be recognized that these embodiments are merely illustrative of the principles of the present invention. Numerous modifications and adaptations will be readily apparent to those of skill in the art without departing from the spirit and scope of the invention.

In one aspect, nanostructured films are described herein. In some embodiments, a nanostructured film comprises an inorganic scaffold comprising particles of insulating inorganic oxide. A conductive metal oxide coating is adhered to the porous inorganic scaffold, wherein the conductive metal oxide coating binds adjacent particles of the insulating inorganic oxide. Turning now to specific components, particles forming the inorganic scaffold can comprise any electrically insulating inorganic oxide not inconsistent with the objectives of the present invention. In some embodiments, insulating inorganic oxide particles are radiation transmissive and can comprise silica, alumina or aluminum oxynitride or combinations thereof. Inorganic oxide particles of the scaffold can be radiation transmissive for light scattering purposes and/or passage of light throughout the nanostructured film. Silica, alumina, aluminum oxynitride and/or other radiation transmissive oxide particles can be employed as scaffold materials in optoelectronic and/or photovoltaic applications, for example. Alternatively, inorganic oxide particles can be non-radiation transmissive or reflective. In some embodiments, reflective inorganic oxide particles can be mixed with radiation transmissive oxide particles in the inorganic scaffold. In this way, light transmission and reflection can be tuned to ensure maximum absorption by the photosensitive layer deposited on the conductive metal oxide coating. In some embodiments, the insulating inorganic oxide particles of the scaffold exhibit a bandgap in excess of the photosensitive layer bandgap, thereby inhibiting or precluding competition between the scaffold and photosensitive layer for light absorption.

The conductive metal oxide coating can comprise any desired conducting metal oxide. In some embodiments, the conducting metal oxide coating is radiation transmissive or transparent in the visible region of the electromagnetic spectrum. Radiation transmissive conducting oxides can comprise one or more transition metals, in some embodiments. Radiation transmissive conducting oxides, for example, can include one or more of zinc oxide, fluorine-doped tin oxide (FTO), indium tin oxide (ITO), gallium indium tin oxide (GITO), aluminum tin oxide (ATO) and zinc indium tin oxide (ZITO). In some embodiments, the conductive metal oxide coating comprises a transition metal oxide.

A photosensitive layer can be deposited over the conductive metal oxide coating. In some embodiments, the photosensitive layer is deposited directly on the conductive metal oxide coating. Alternatively, one or more layers can be positioned between the conductive metal oxide coating and photosensitive layer, wherein the photosensitive layer is in electrical communication with the conductive metal oxide coating. Any photosensitive layer not inconsistent with the objectives of the present invention can be deposited on the conductive metal oxide coating. The photosensitive layer may be a single layer or can comprise any number of sublayers. In some embodiments, the photosensitive layer can comprise one or more inorganic materials, such as transition metal oxides including, but not limited to, zinc oxide, tungsten oxide, ruthenium oxide, iron oxide, cuprous oxide, cupric oxide and combinations thereof. Inorganic materials of the photosensitive layer can also include II/VI, III/V or Group IV semiconductor materials. Suitable inorganic semiconductor materials can also include ternary and quaternary systems having elements selected from Groups IB, IIB and IIIA-VIA of the Periodic Table. In some embodiments, polycrystalline silicon and/or amorphous silicon can be deposited on the conductive metal oxide coating. Alternatively, the photosensitive layer can be composed of organic components. In some embodiments, the photosensitive layer comprises one or more conjugated polymers, organic small molecules or combinations thereof. In some embodiments, an organic photosensitive layer exhibits a bulk heterojunction architecture wherein a nanoparticle acceptor phase is dispersed in a light absorbing conjugated polymer and/or organic small molecule donor phase.

Inorganic and organic materials and architectures of the photosensitive layer residing on or over the conductive oxide coating of the inorganic scaffold can be selected according to the desired light absorption characteristics of the nanostructured film. The photosensitive layer can be tailored to absorb light in the near-UV, visible and/or infrared regions of the electromagnetic spectrum. Moreover, the photosensitive layer can have any desired thickness. In some embodiments, the photosensitive layer has thickness of 10 nm to 1 µm. In other embodiments, the photosensitive layer can have thickness of 10-100 nm or greater than 1 µm.

Pore structure of the inorganic scaffold can adopt various configurations to provide desired mass transport properties of reactants. In some embodiments, pore size is uniform throughout the nanostructured film. In other embodiments, pore size is heterogeneous in the nanostructured film. For example, one or more pore size gradients can exist along the film thickness. Moreover, the inorganic scaffold can exhibit a uniform pore distribution. Alternatively, the pore distribution can be heterogeneous, thereby increasing the tortuosity factor. As described further herein, pore size and distribution can be tightly controlled by selection of colloidal polymeric particles. Sizes and amounts of colloidal polymeric particles can be chosen according to the desired properties of the porous inorganic scaffold, including mass transfer properties, surface area and various mechanical properties including overall porosity. In some embodiments, porosity of the nanostructured film can range from 10 volume percent to 90 volume percent.

In another aspect, photoelectrochemical cells are provided. A photoelectrochemical cell comprises a photoelectrode comprising a nanostructured film, the nanostructured film comprising a porous inorganic scaffold including particles of insulating inorganic oxide. An electrically conductive metal oxide coating is adhered to the porous inorganic scaffold, wherein the conductive metal oxide coating binds adjacent particles of the insulating inorganic oxide. A photosensitive layer is deposited on the conductive metal oxide coating. The nanostructured film can have any composition and/or properties described hereinabove.

In a further aspect, methods of forming nanostructured layers are described herein. A method of forming a nanostructured layer comprises providing a mixture of colloidal polymeric particles and colloidal, electrically insulating inorganic oxide particles and depositing an electrically conductive metal oxide coating on the insulating inorganic oxide particles. The colloidal polymeric particles are removed to provide a porous inorganic scaffold comprising the insulating inorganic oxide particles bound together by the conductive metal oxide coating. In some embodiments, a photosensitive layer is deposited on the conductive metal oxide coating.

The colloidal insulating inorganic oxide particles can have any compositional identity described above. While insulating oxide particles are primarily described herein, other ceramic materials can serve as suitable substitutes for the inorganic oxide particles in the scaffold. In some embodiments, for example, a porous inorganic scaffold is formed of electrically insulating transition metal nitrides, transition metal carbides, transition metal carbonitrides, transition metal borides or silicides, transition metal oxynitrides, boron nitride or various combinations thereof.

Moreover, the compositional identity of the colloidal polymeric particles can be selected according to several considerations including, but not limited to, maintaining susceptibility to removal subsequent to deposition of the conductive metal oxide coating and general inertness to reagents and processes employed to deposit the conductive metal oxide coating. In some embodiments, for example, the colloidal polymeric particles comprise polystyrene (PS) and/or copolymers and derivatives thereof. In some embodiments, the colloidal polymeric particles exhibit low polydispersity and are of generally uniform size to provide a generally uniform pore size and/or pore structure in the nanostructured film. Alternatively, the colloidal polymeric particles can have heterogeneous particle size to provide a variety of pore sizes and/or pore structures in the nanostructured film. In some embodiments, the colloidal polymeric particles can have a bimodal or multimodal size distribution. The colloidal polymeric particles and insulating inorganic oxide particles can be mixed in any desired proportion to provide desired porosity, surface area and other mechanical properties of the nanostructured film.

The conductive metal oxide film can be deposited by various techniques including atomic layer deposition (ALD) or surface sensitive chemical synthesis technique. In some embodiments, for example, zinc oxide is deposited by ALD via a zinc organometallic precursor and oxidant. Organometallic precursor can be diethyl zinc, wherein water or oxygen is the oxidant. The conductive metal oxide layer can be selectively deposited on the insulating oxide particles of the scaffold, in some embodiments. Conductive metal oxide can also be deposited on the colloidal polymeric particles. However, the conductive metal oxide layer should not preclude removal of the colloidal polymeric particles by etching or other technique. The deposited conductive metal oxide layer binds the inorganic oxide particles of the scaffold together. In some embodiments, the inorganic oxide particles of the scaffold are surface functionalized with transition metal oxide nanoparticles. Deposition of the conductive metal oxide layer can result in the transition metal oxide nanoparticles being dispersed in the conductive metal oxide layer.

Figure 9:
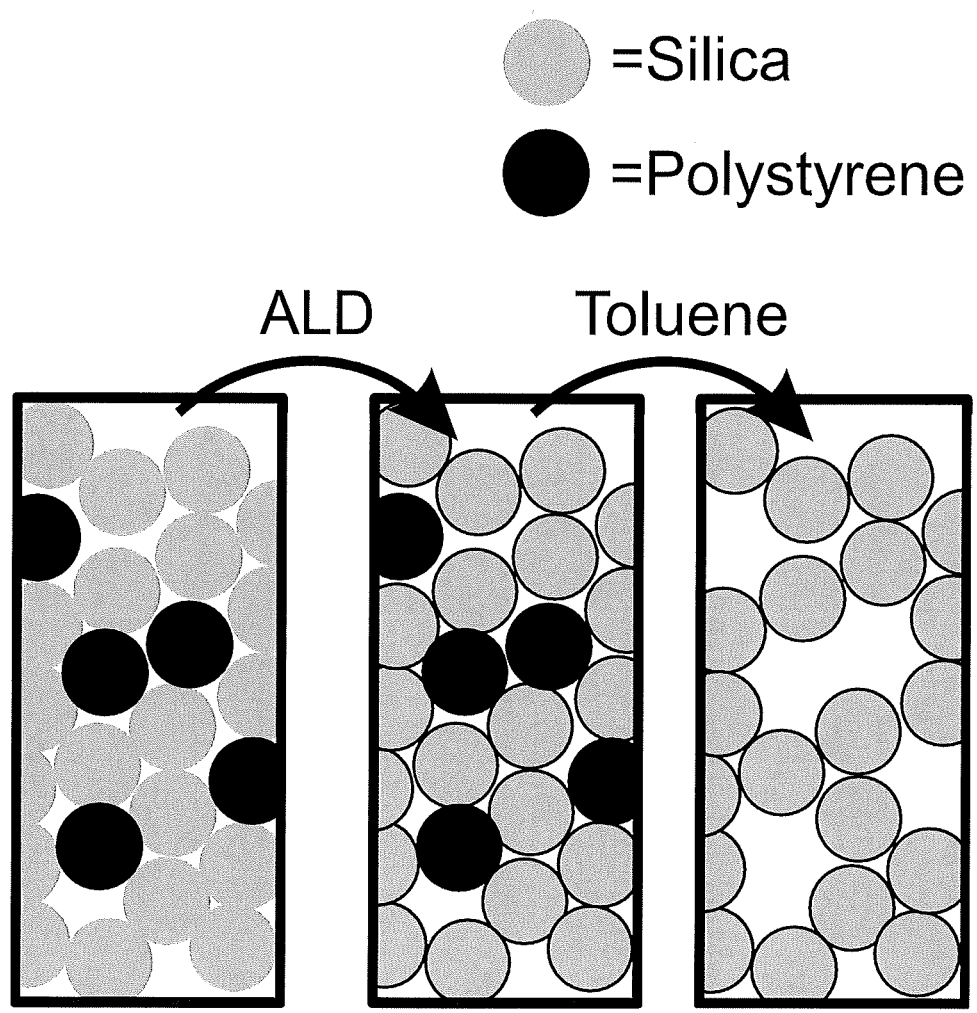
FIG. 9 is a schematic illustrating a method of forming a nanostructured layer according to some embodiments described herein.

FIG. 9 is a schematic illustrating a method of forming a nanostructured layer according to some embodiments described herein. As illustrated in FIG. 9, the dark colored balls represent colloidal silica particles, and the light-colored balls represent colloidal polystyrene. The colloidal silica and polystyrene are mixed in the desired proportion and a conductive metal oxide layer is selectively deposited on the silica particles as represented by the black outline. The conductive metal oxide layer adheres or binds adjacent silica particles. The polystyrene particles are subsequently etched away or otherwise removed leaving behind a porous silica scaffold coated with conductive metal oxide. A photosensitive layer can be deposited on the conductive metal oxide coating of the inorganic scaffold.

These and other embodiments are further illustrated by the following non-limiting examples.

Example 1—Hierarchically Nanostructured Films

Hierarchically nanostructures films were fabricated and characterized as follows.

Experimental Section

Solvents such as acetone (99.5%; EMD Millipore Corp), methanol (HPLC grade; VWR Analytical), isopropanol (HPLC grade; VWR Analytical), toluene (99.5% pure, VWR Analytical), and water (HPLC grade; VWR Analytical) were used as received. Si wafers (n-type, single-side polished, <0.001 Ωcm; Silicon Materials Inc.) were diced into 1.5 cm×1.5 cm square substrates, then used as received. Fluorine-doped tin oxide (FTO)-coated glass slides (TEC 15, 12-14 Ωsq$^{-1}$; MTI Corp) were diced into 2.5 cm×1 cm slides for use as deposition substrates. Aqueous solutions of monodisperse polystyrene colloidal spheres (2.6% w/w polystyrene concentration; Polysciences Inc.) were used as received. Aqueous solutions of monodisperse $SiO_2$ nanospheres (1% w/w $SiO_2$; NanoComposix) were used as received. Si and FTO substrates were cleaned before use by a sequential rinse in acetone, methanol, isopropanol, and water. Water evaporation during colloidal film synthesis was performed in an incubator with digital temperature control (VWR). High-temperature annealing of substrates was performed in air in a muffle furnace equipped with a digital temperature controller (Thermolyne). Materials characterization: Scanning electron microscopy (SEM) micrographs of colloidal films were taken with either a Philips XL-30 FEG SEM or FEI Nova Nanolab 200. Energy-dispersive x-ray (EDX) spectra were measured at an incident electron energy of 15 keV with a Bruker) (Flash 5010 accessory attached to the FEI SEM. X-ray photoelectron spectroscopy (XPS) measurements were performed on a PHI Versaprobe instrument with a monochromated Al Kα source (1486.6 eV).

Preparation of Colloidal Thin Films:

Single component thin films of 375 nm PS or 400 nm $SiO_2$ nanoparticle thin films were prepared by dropcasting. A drop of each concentrated stock solution (75 μL) was pipetted directly onto a Si substrate. The water was evaporated at 60° C. until the film was dry.

'Host-guest' composites of large PS spheres and small $SiO_2$ spheres were self-assembled on FTO substrates by the slow evaporation of mixed solutions of colloids. Prior to deposition, FTO substrates were cleaned in a UV-Ozone cleaner (30 min) to increase the hydrophilic behavior of the surface. Dilute solutions of the desired PS (0.5% w/w) and SiO$_2$ (1% w/w) colloids were prepared by adding H$_2$O to small volumes of the stock solutions. Composite solutions of PS and SiO$_2$ spheres were prepared from mixtures of the diluted solutions in a 90% PS to 10% SiO$_2$ ratio by mass. Each host-guest colloidal film was prepared by placing an FTO substrate at a slight angle into a 20 mL HDPE scintillation vial filled with a volume of the composite solution of interest (4 mL). The self-assembly evaporation step was performed at 45° C. for films comprised of PS colloids with diameters greater than or equal to 1.0 μm. To account for the observed high rate of sedimentation for larger colloids, solutions comprised of PS spheres with diameters larger than 1.0 μm or SiO$_2$ spheres with diameters larger than 200 nm were evaporated more rapidly at 60° C.

'Knock-out glass' composite colloidal films were prepared by mixing diluted solutions of SiO$_2$ and PS colloids (1.56 mg mL$^{-1}$ in water). The single-component solutions of 500 nm PS and 300 nm SiO$_2$ colloids were combined to achieve mixtures of 7.5% (w/w) and 20% (w/w) 500 nm PS solution by total mass of colloidal material. A drop of the mixed solution (75 μL) was evaporated on a horizontal Si substrate to form the colloidal thin film (70° C. for 30 minutes). The contact area of the drop was defined by a small Teflon washer (0.5" inner diameter, 0.0930" thick) held in place on the substrate by two binder clips. After evaporation, the Teflon washer was removed, leaving a defined circular film in the center of the substrate.

Atomic Layer Deposition of ZnO:

ZnO thin films were synthesized from diethylzinc (DEZ; 95%; Strem, Inc.) and H$_2$O (HPLC grade; VWR Analytical) precursors in an atomic layer deposition reactor (GEMStar XT; Arradience, Inc.). Ultra-high purity N$_2$ (99.999%; Airgas) was used as the carrier gas in the reactor and was controlled by a mass flow controller. Each ZnO film described here was synthesized with the following ALD procedure (abbreviated ALD-ZnO). The substrate of interest was placed in the reaction chamber and held at 80° C. Each cycle of the ALD-ZnO process included sequential exposures to DEZ and H$_2$O precursors from room-temperature bubblers. Each DEZ exposure consisted of a precursor pulse (22 ms under 40 sccm N$_2$ carrier gas flow), a precursor soaking step (5 s, 40 sccm N$_2$ with the pump valve closed) to maximize the exposure of the high-aspect ratio substrates to the reactants, and a pump down step (18.5 s, 100 sccm N$_2$) to purge the chamber of precursor. Each H$_2$O exposure consisted of a precursor pulse (22 ms, 40 sccm N$_2$), a soaking step (5 s, 40 sccm N$_2$ with the pump valve closed), and a pump down step (28 s, 90 sccm N$_2$).

Results

Figure 1B:
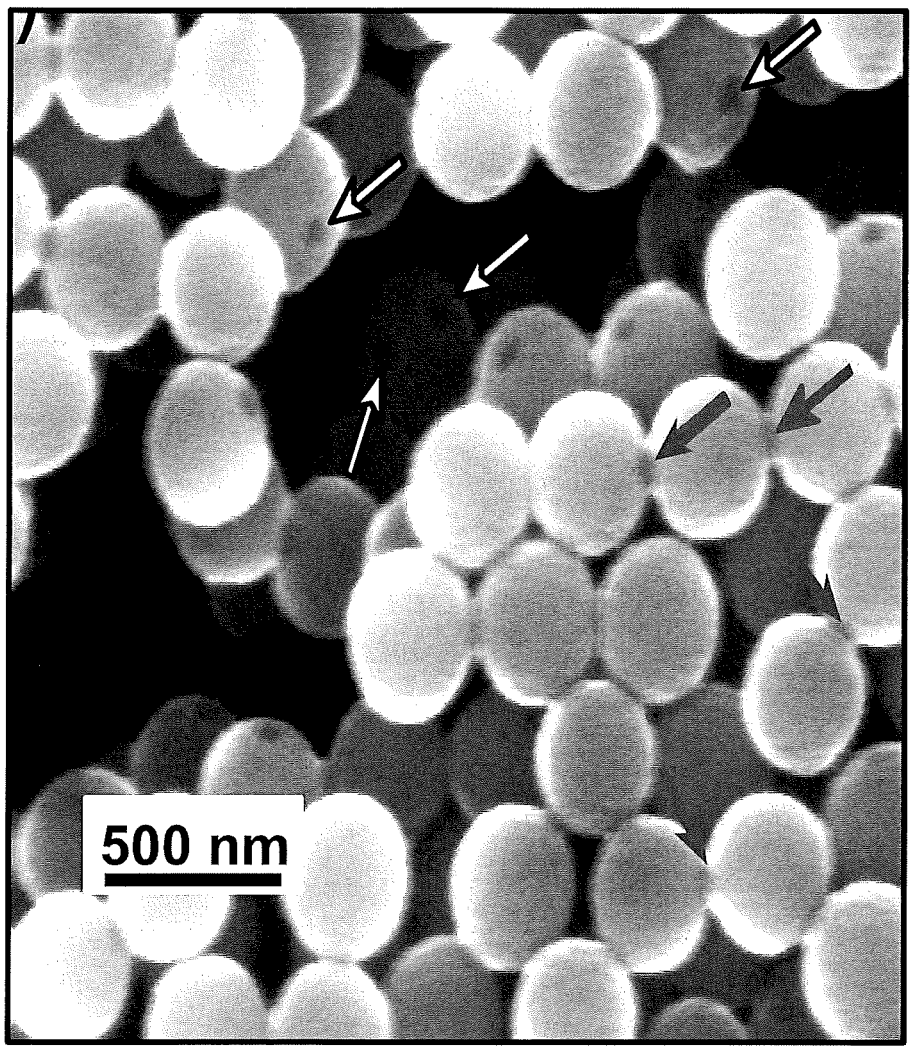
FIG. 1B—SEM micrograph of the ALD-ZnO deposited on 400 nm $SiO_2$ spheres. Red arrows indicate regions where the ZnO bridges $SiO_2$ spheres. Green arrows indicate regions where bridged colloids disconnect, leaving a visible shadow in the ZnO film.
Figure 1C:
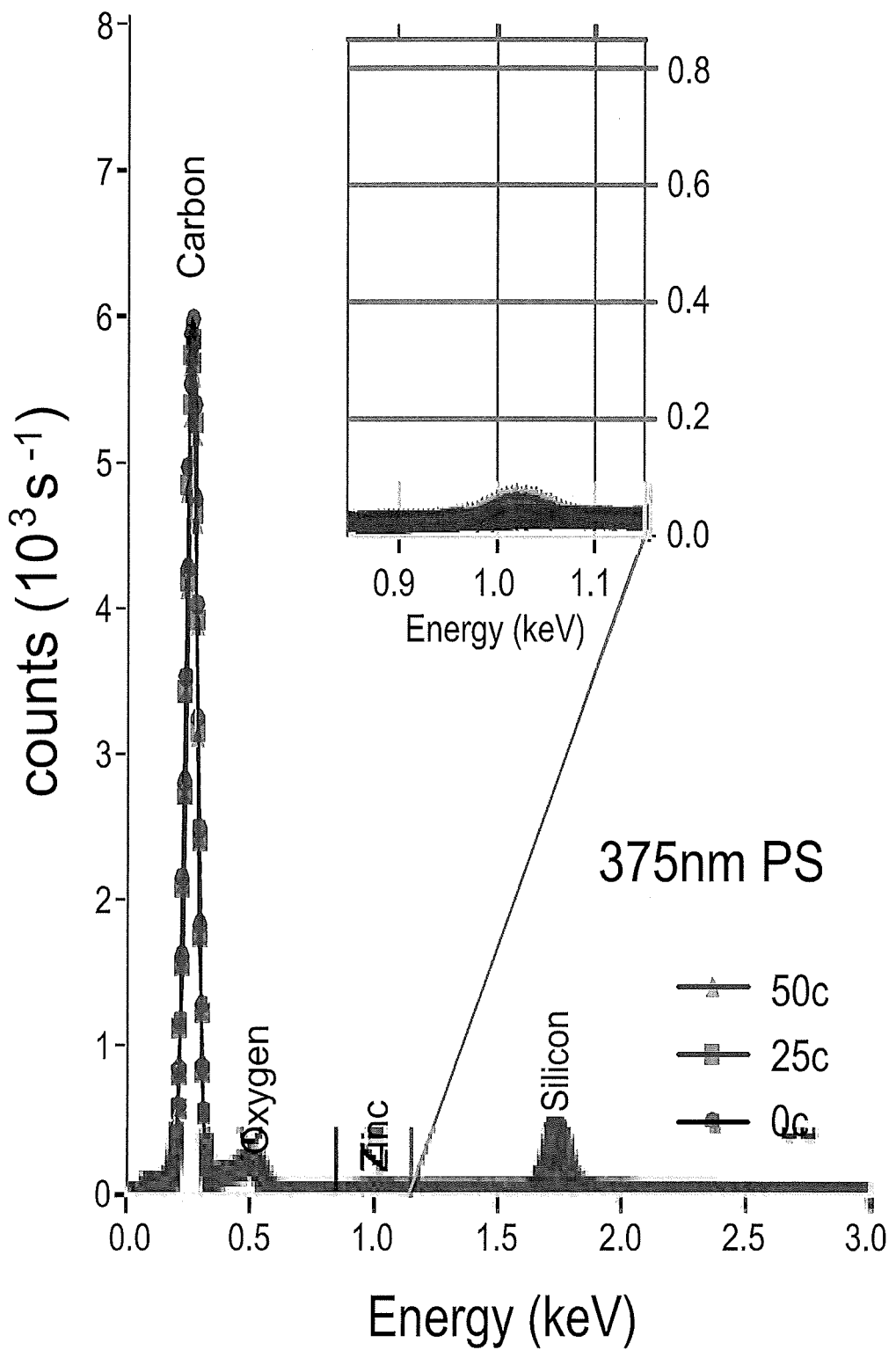
FIG. 1C—EDX spectra of 0c, 25c, and 50c ALD-ZnO on thin films of close-packed, 375 nm PS nanospheres, with a magnified view of the Zn peak (inset).

Single-component (SiO$_2$ or PS) dropcast films of close-packed nanospheres were prepared as hierarchically structured substrates to characterize the deposition of thin layers of ZnO by ALD. The dropcast SiO$_2$ and PS colloidal films were exposed to 0, 25, or 50 cycles (0c, 25c, 50c) of the ALD-ZnO process described above at a substrate temperature of 80° C. It was estimated that a 50c ALD-ZnO film grown on a planar substrate is roughly 7 nm thick from growth rates reported elsewhere for similar growth conditions (0.14 nm per cycle at 80° C.). Film thickness will vary on a non-planar substrate such as thin films of close-packed colloids. Area-integrated EDX spectra were measured over a 40 um×50 um region of SiO$_2$ colloidal films exposed to an increasing number of cycles of ALD-ZnO (FIG. 1a). The magnitude of the Zn peak in the EDS spectra increased linearly with increasing number of ALD-ZnO cycles, indicating that the quantity of ZnO in the films increases with increasing exposure. SEM images of 400 nm SiO$_2$ spheres prepared with 50c of ZnO are shown in FIG. 1b. The ZnO film was visible as a bridge between neighboring spheres (red arrows). The shadow of areas lacking ZnO on the spheres (green arrows) indicate broken contact between spheres after ALD-ZnO deposition. Area-integrated (40 um×50 um) EDS spectra were also measured on PS colloidal films exposed to the ALD-ZnO process under identical conditions to the SiO$_2$ colloidal films (FIG. 1c). Compared to the measurements on SiO$_2$, a negligible amount of Zn is observed in the measured EDS spectra on PS even at the highest exposure (50c).

Figure 2:
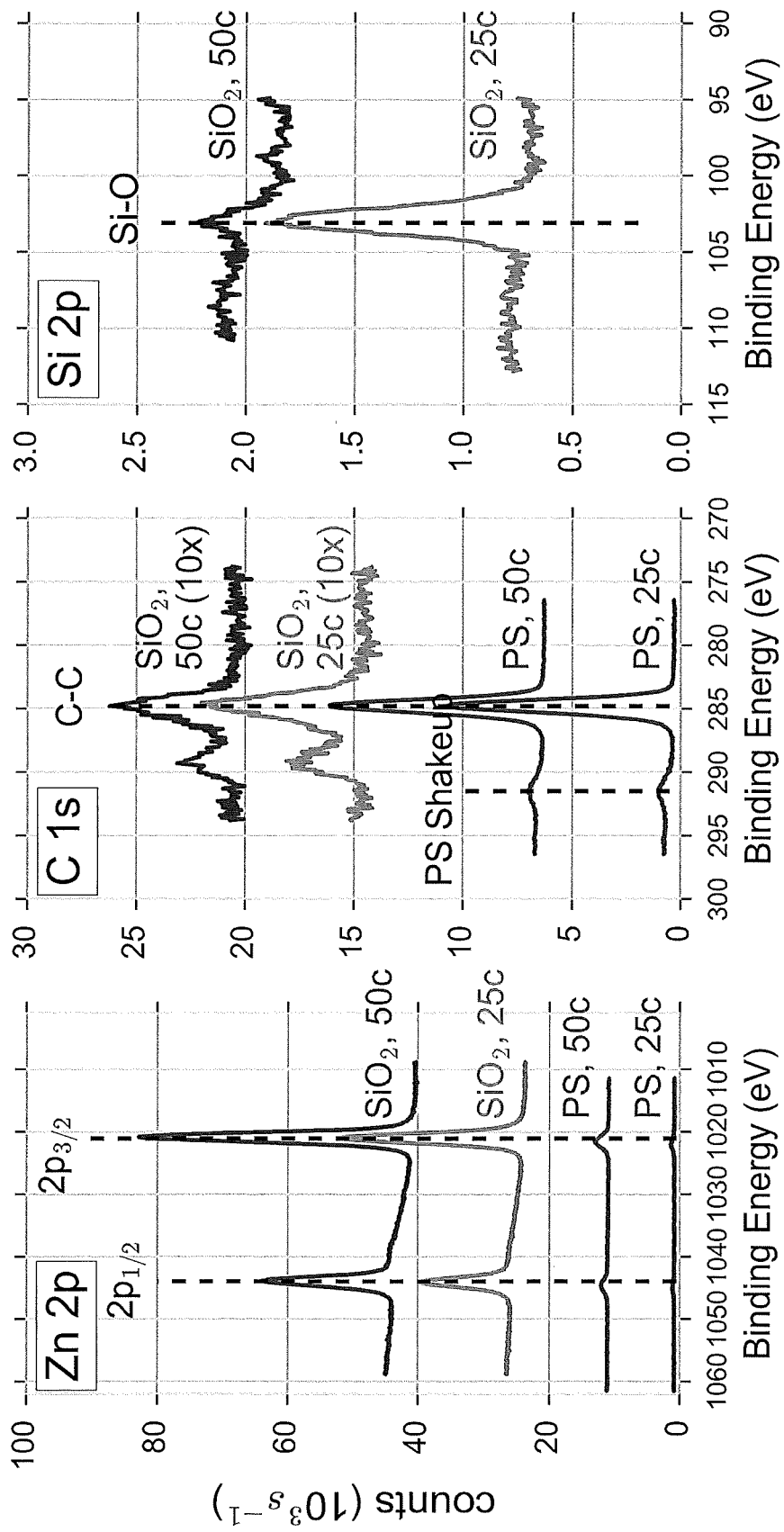
FIG. 2—Zn 2p, C 1s, and Si 2p XPS spectra measured on thin films of close-packed, 375 nm PS nanospheres exposed to 25c (red) and 50c (blue) of ALD-ZnO, and on thin films of close-packed, 400 nm $SiO_2$ nanospheres exposed to 25c (green) and 50c (purple) of ALD-ZnO.

The surface specificity of the ALD-ZnO process on PS and SiO$_2$ colloidal assemblies was characterized by XPS (FIG. 2). A small amount of Zn is observed on the surface of PS nanospheres in the Zn 2p XPS spectra. While the intensity of the Zn 2p peak increases with an increase in the number of ALD cycles on PS nanosphere films (PS, 25c; PS, 50c), it is negligible compared to the intensity observed on the SiO$_2$ nanosphere films (SiO$_2$, 25c; SiO$_2$, 50c). The C is XPS intensity in the peaks representing the C—C bond and the π-π* shake-up satellite peak characteristic of polystyrene indicate that the surface of the PS films is primarily polystyrene. For comparison, the low intensity of the Si—O feature in the Si 2p XPS spectra for SiO$_2$ indicates that the thickness of the deposited 50c ALD-ZnO film is thicker than the inelastic mean free path of photoelectrons (2-5 nm) and forms a conformal layer over the SiO$_2$ nanospheres.

Figure 3:
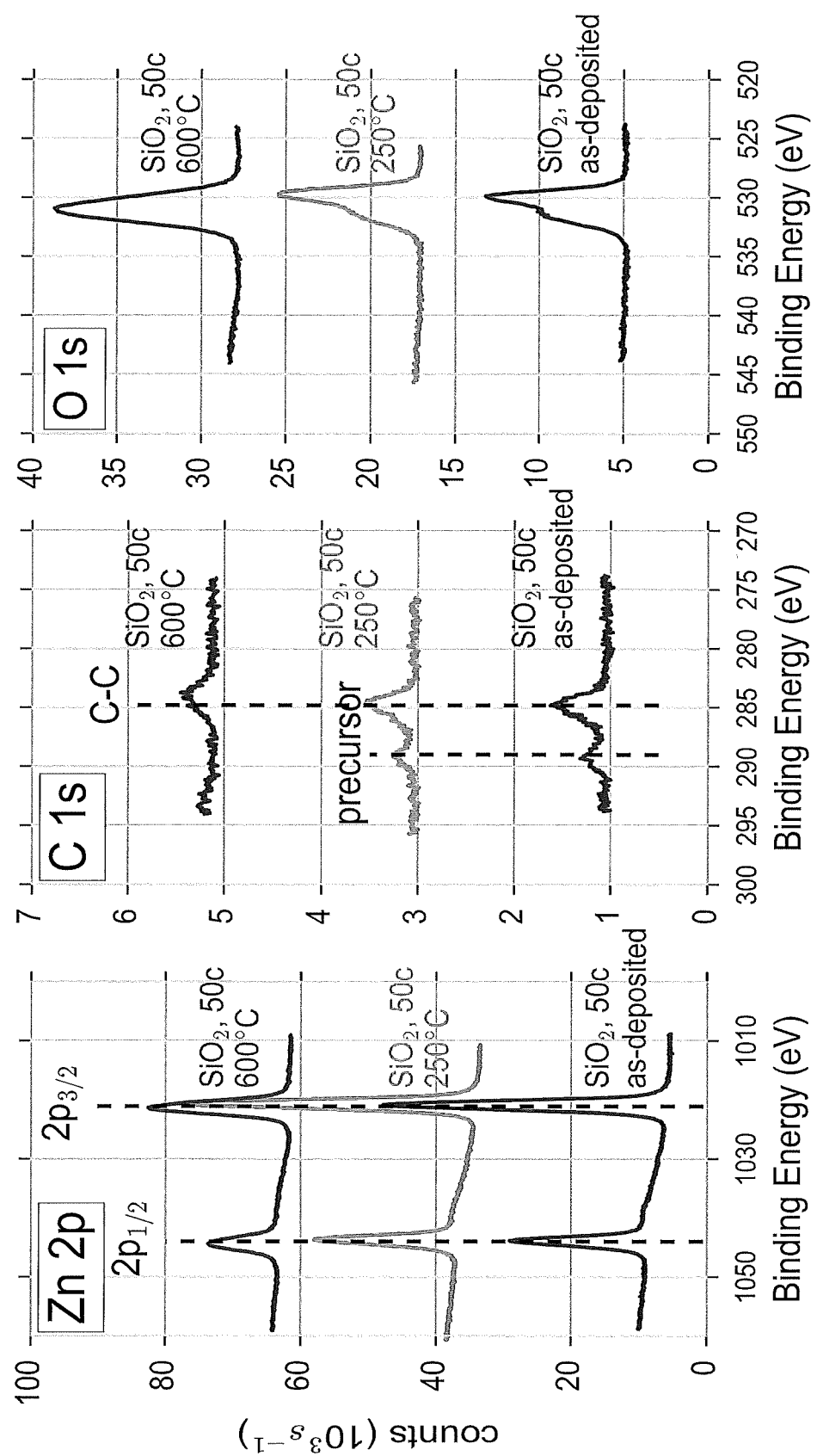
FIG. 3—Zn 2p, C 1s, and O 1s XPS spectra measured on thin films of close-packed, 400 nm $SiO_2$ nanospheres exposed to 50c of ALD-ZnO as deposited (purple), after one hour anneal in air at 250° C. (orange), or after one hour anneal in air at 600° C. (brown).

ALD-ZnO films grown via DEZ and H$_2$O are typically grown at temperatures greater than 140° C. Substrate temperatures of 80° C. were chosen for this work in order to preserve the structure templated by PS colloids, which can flow at temperatures in excess of the glass transition temperature of approximately 95° C. The effect of annealing on the composition of ALD-ZnO grown via this low temperature process were characterized by XPS (FIG. 3). Identically prepared 50c ALD-ZnO films prepared on dropcast 400 nm SiO$_2$ nanosphere films were annealed in air either at 250° C. or at 600° C. for 1 hour (20° C./min ramp to set temperature). 600° C. is a general upper bound for annealing temperatures preparing metal oxide thin films, so it is important that the final electrode structure remain intact after exposure to that temperature. The C 1s XPS spectra for ALD-ZnO grown at 80° C. exhibits a peak at 289 eV, indicating the presence of incompletely decomposed precursor. This peak is considerably smaller than the intensity of the adventitious C feature at 284.8 eV. There is no discernable difference observed in the XPS spectra for the as-deposited films and the films annealed at 250° C. for the Zn 2p, C 1s, or O 1s XPS spectra. At 600° C., the peak attributed to partially decomposed precursor is no longer present in the spectra. Additionally, an increase in the intensity of the peak at 532 eV (Si—O) relative to the 530 eV (Zn—O) peak in the O 1s spectra suggests that the high temperature annealing exposes a portion of the underlying SiO$_2$ spheres due to fracture of the thin ALD-ZnO layer.

As a test of the binding ability of the thin ALD-ZnO, the mechanical stability of single-component PS nanosphere and SiO$_2$ nanosphere films were studied under conditions intended to disrupt them. As expected, PS was easily dissolved in organic solvents like toluene. After a 50c exposure of ALD-ZnO, the PS nanosphere film was observed to dissolve in toluene held at 60° C. for 24 hours. Negligible amounts of ZnO were observed on the surface of the PS nanosphere films, so no inorganic coating shell had formed to protect the underlying polystyrene from dissolution. PS nanosphere films exposed to 50c of ALD-ZnO were heated to 600° C. in air for 180 minutes. The polystyrene was burned out, removing all organic material from the Si wafer substrate.

Figure 4A:
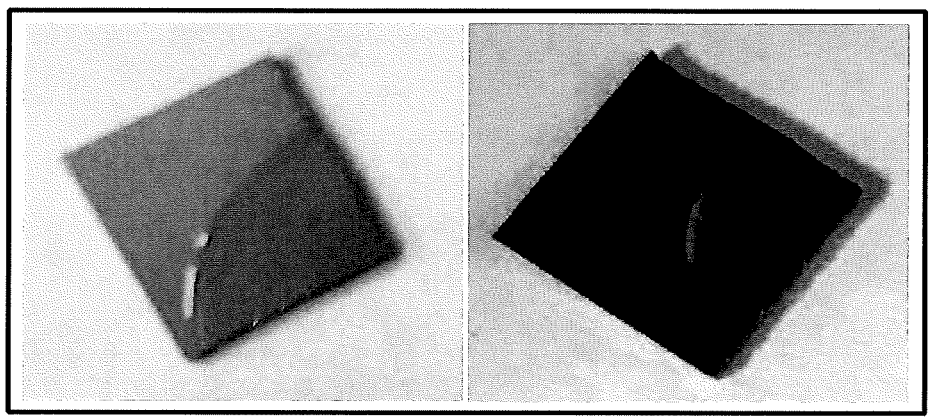
FIG. 4A—A dropcast thin film of 400 nm $SiO_2$ annealed at 600° C. for one hour as prepared and after 10 minutes of sonication in toluene.
Figure 4B:
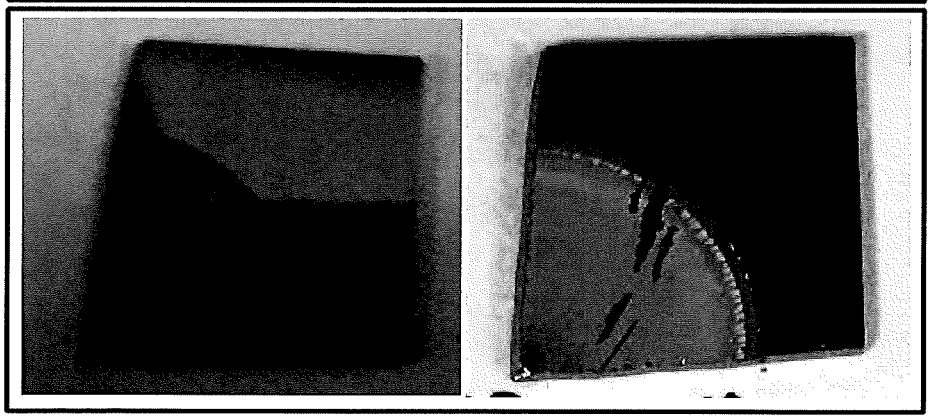
Figure 4C:
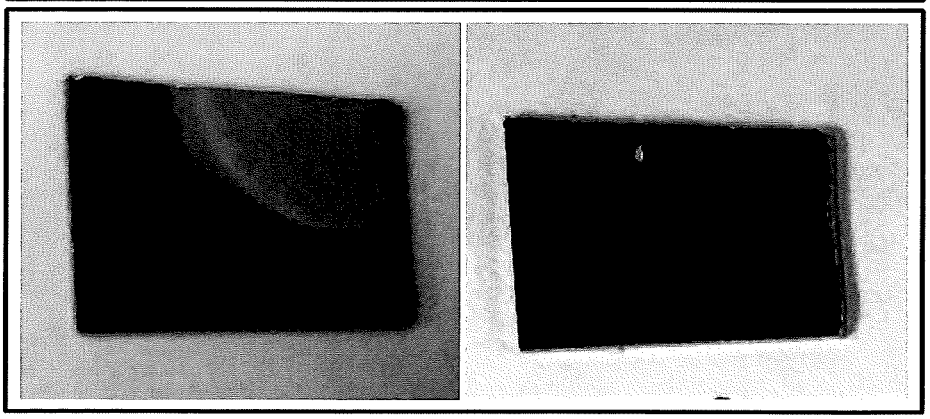

$SiO_2$ nanosphere films remained after a 24-hour submersion in toluene at 60° C., regardless of prior exposure to the ALD-ZnO process. The films do not easily dissolve in toluene after being dried from solution due to the general cohesive Van der Waals attraction characteristic of a nanopowder. When the sonicated in toluene, the dried $SiO_2$ nanosphere films dissolved from the substrate within 10 minutes. $SiO_2$ nanosphere films annealed at 600° C. for one hour also dissolved from the Si wafer substrate after 10 minutes, indicating that this temperature is not sufficient to sinter the nanosphere film into a continuous solid or to mechanically stabilize it on the substrate (FIG. 4a). $SiO_2$ nanosphere films prepared with 50c of ALD-ZnO were stable under 10 minutes of sonication in toluene (FIG. 4b), indicating that the spheres in the films are mechanically bound together by the thin layer of ZnO. $SiO_2$ nanosphere films that were prepared with 50c of ALD-ZnO, then annealed at 600° C. in air for 60 minutes were removed from the substrate after 10 minutes of sonication in toluene (FIG. 4c). This indicates that the ZnO film was weakened in the annealing process, resulting in mechanical failure under the sonication in the solvent. However, these experiments demonstrate that after 50c of ALD-ZnO, PS spheres can be removed from the film, while $SiO_2$ spheres can be bound and preserved under the same conditions.

Figures 5A, 5B, 5C:
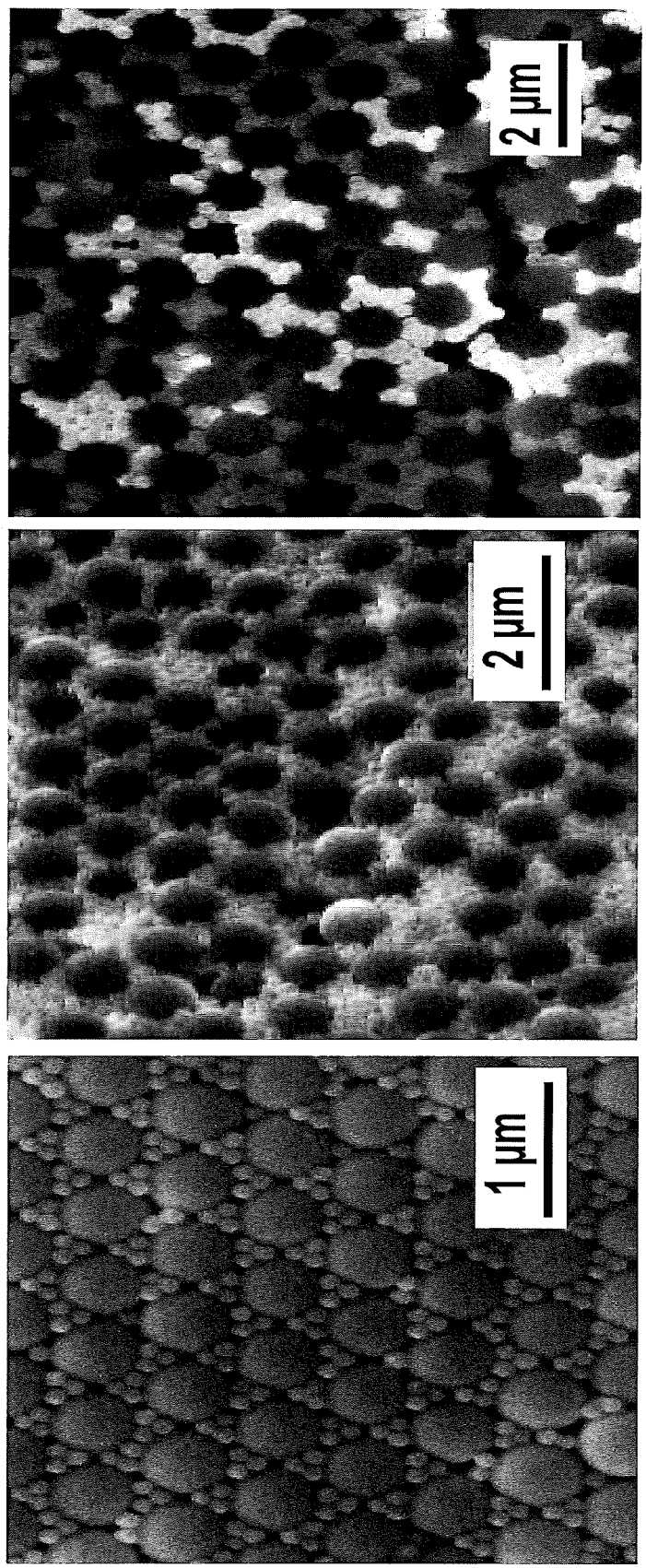
FIG. 5A—Self-assembled, PS-$SiO_2$ composite host-guest colloidal crystals prepared from 0.5 μm PS and 100 nm $SiO_2$ colloids.
FIG. 5B—Self-assembled, PS-$SiO_2$ composite host-guest colloidal crystals prepared from 0.75 μm PS and 140 nm $SiO_2$ colloids.
FIG. 5C—Self-assembled, PS-$SiO_2$ composite host-guest colloidal crystals prepared from 1.0 μm PS and 200 nm $SiO_2$ colloids.

The demonstrated difference in the ALD-ZnO and dissolution susceptibilities of the $SiO_2$ and PS were used to synthesize composite electrodes with independently tunable pore diameter and density. One motif is the 'host-guest' composite colloidal crystals of large diameter PS spheres ($d_{PS}$=0.5-2.0 μm) and small diameter $SiO_2$ nanospheres ($d_{Si}$=100-400 nm). The slow evaporation of a solution of small $SiO_2$ spheres and large PS spheres formed a composite thin-film colloidal crystal. The 'host' PS lattice formed in the same close-packed, crystalline lattice that it would when prepared identically from a single-component solution. The $SiO_2$ 'guest' nanospheres formed a close-packed structure that filled the void space of the PS lattice. The assembly of this host-guest structure was driven by solvent evaporation for mixed colloidal solutions of $SiO_2$ and PS colloids with diameter ratios of roughly $d_{Si}/d_{PS}$<0.20 and for $d_{PS}$≤2.0 μm (FIG. 5). Solutions consisting of larger diameter colloids were affected by an observed increase in sedimentation rate, which resulted in more inhomogeneous and phase-segregated films. The effects of sedimentation where counteracted somewhat by increasing the evaporation rate by raising the temperature from 45° C. to 60° C. for these compositions, though this reduces the thickness of the resulting films.

Figure 6A:
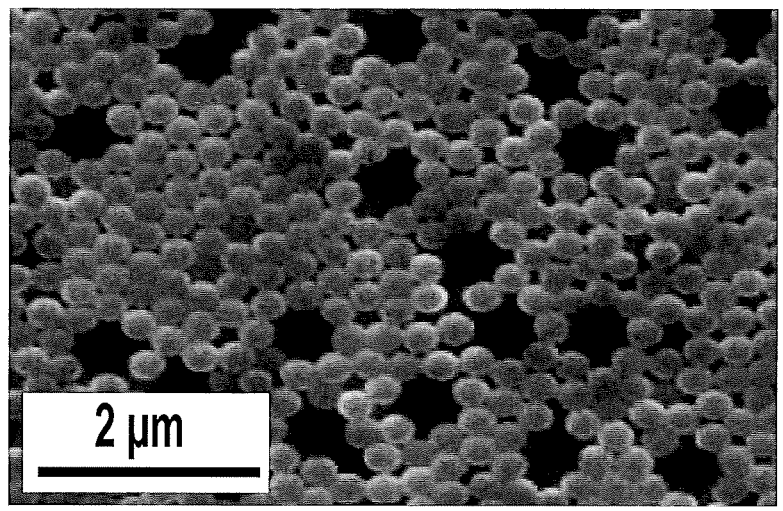
FIG. 6A—Self-assembled knock-out glass films of 0.5 μm PS and 300 nm $SiO_2$ prepared with 7.5% colloidal mass fraction of PS.
Figure 6B:
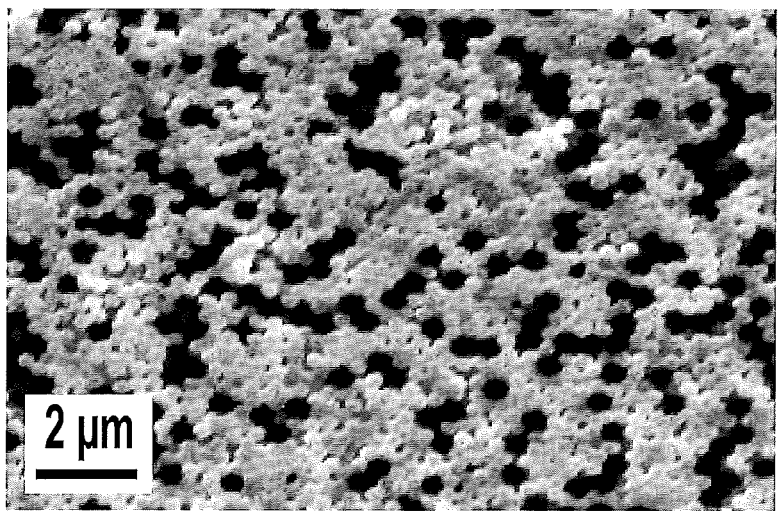
FIG. 6B—Self-assembled knock-out glass films of 0.5 μm PS and 300 nm $SiO_2$ prepared with 20% colloidal mass fraction of PS.

Another composite structure, referred to here as a 'knock-out glass', was prepared by the rapid drying of solutions of $SiO_2$ and PS nanospheres of similar diameters. The quick evaporation results in a disordered but homogeneous distribution of PS and $SiO_2$ spheres that is determined by the relative concentrations of the two colloidal populations. Examples of these composites at 7.5% and 20% (mass of PS/mass of total colloidal matter) 0.5 μm PS and 300 nm $SiO_2$ are shown in FIG. 6(a-b).

Host-guest and knock-out glass composite films were coated with 50 cycles of ALD-ZnO. The PS spheres in composites were removed by burn-off in a muffle furnace at 600° C. in air for 3 hours. Remaining organic material was removed by dissolution in toluene at 60° C. The host-guest composite formed an inverse opal structure of $SiO_2$ colloids, which were bound into a solid that remained after the polystyrene was removed (FIG. 7 a-d). In each of the examples in FIG. 7, the diameter ratio $d_{Si}/d_{PS}$=0.20. The host-guest composite formed similar $SiO_2$ nanosphere inverse opals for diameter ratios smaller than 0.20.

Figure 8A:
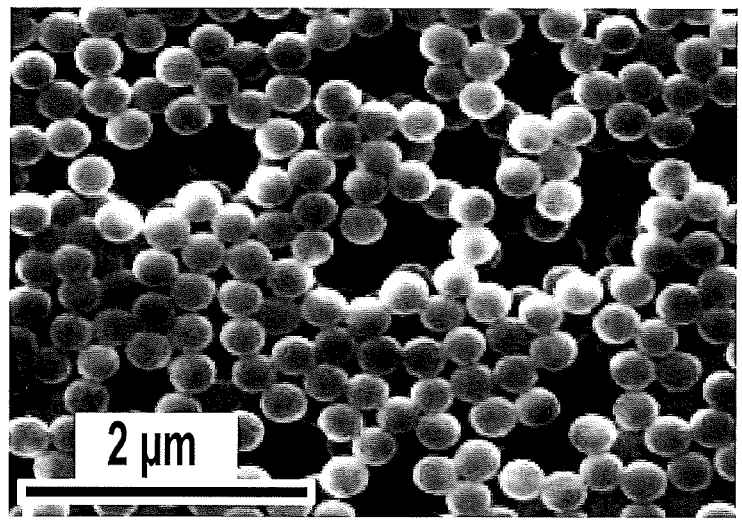
FIG. 8A—SiO$_2$/ZnO colloidal glass structures fabricated from knock-out glass templates of 0.5 µm PS and 300 nm SiO$_2$ prepared with 7.5% colloidal mass fraction of PS.
Figure 8B:
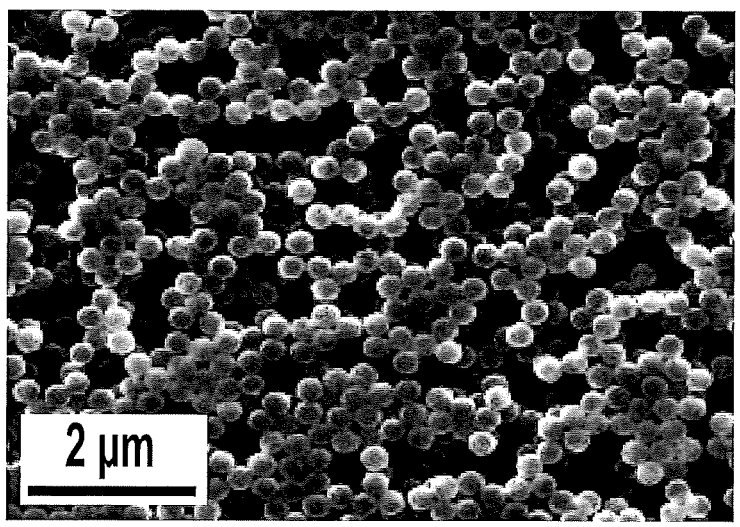
FIG. 8B—SiO$_2$/ZnO colloidal glass structures fabricated from knock-out glass templates of 0.5 µm PS and 300 nm SiO$_2$ prepared with 20% colloidal mass fraction of PS.

Similarly, the knock-out glass composite resulted in a disordered $SiO_2$ film with a homogeneously distributed network of large pores that had been occupied by a PS sphere before the burn out step. FIG. 8 shows the resultant structures of the knock-out glass composites in FIG. 6 after 50c of ALD-ZnO and PS removal. In both cases, the ALD-ZnO layer bound the close-packed $SiO_2$ assembly around a network of pores defined by the diameter and fraction of PS initially in the templating structure. The structure of the solid and of the network of pores can be defined independently, resulting in a continuously tunable method for the simple fabrication of hierarchically structured nanomaterials.

Figure 7A:
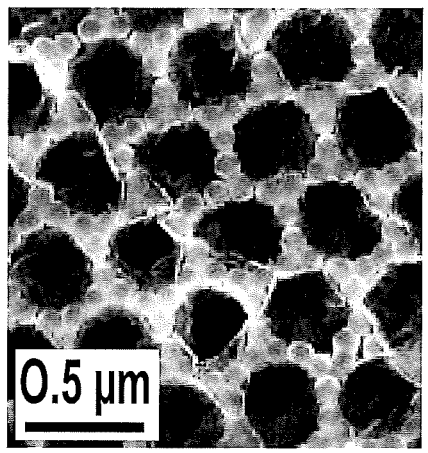
FIG. 7A—$SiO_2$/ZnO colloidal inverse opal structures templated by host-guest colloidal crystals prepared from 0.5 μm PS/100 nm $SiO_2$ colloids.
Figure 7B:
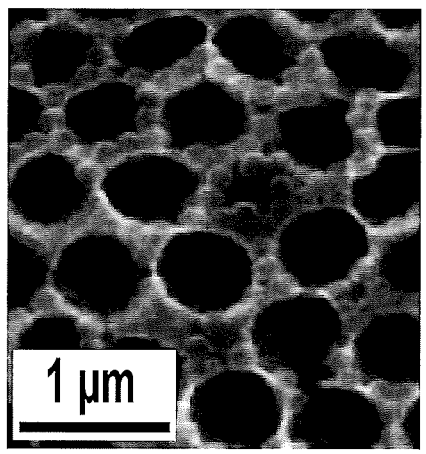
FIG. 7B—$SiO_2$/ZnO colloidal inverse opal structures templated by host-guest colloidal crystals prepared from 0.75 μm PS/140 nm $SiO_2$ colloids.
Figure 7C:
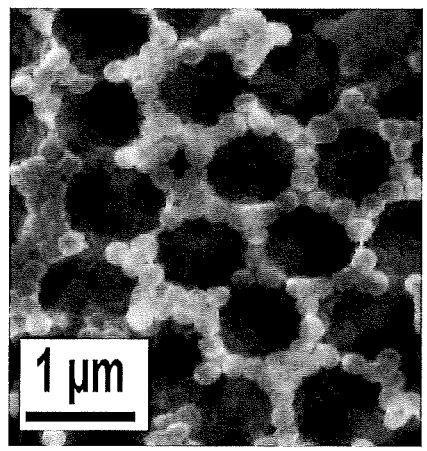
FIG. 7C—$SiO_2$/ZnO colloidal inverse opal structures templated by host-guest colloidal crystals prepared from 1.0 μm PS/200 nm $SiO_2$ colloids.
Figure 7D:
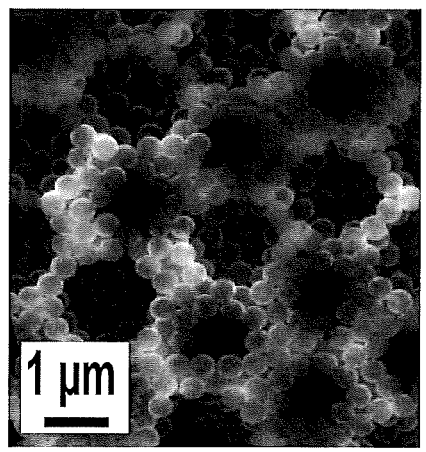
FIG. 7D—SiO$_2$/ZnO colloidal inverse opal structures templated by host-guest colloidal crystals prepared from 2.0 µm PS/400 nm SiO$_2$ colloids.

The experiments described here demonstrate that a hierarchically structured, solid electrode can be fabricated simply by depositing thin layers of ALD-ZnO on a thin film of colloidal spheres with dissimilar chemical susceptibilities. Patterned selectivity for a particular ALD reaction is a proven strategy for spatial control of growing films on surfaces. In the three-dimensional colloidal composite, the specificity of the ALD deposition process enables the selective preservation of the $SiO_2$ portion of the $SiO_2$/polystyrene composite colloidal films. The key distinction between the two surfaces is the absence of functional groups on the polystyrene colloids that are susceptible to the ALD growth of ZnO from DEZ and water. This is consistent with the observation that polystyrene is susceptible to DEZ/water ALD growth only after exposure to UV light and $O_2$, which photo-oxidizes the phenyl groups on the polymer to form hydroxyl, carbonyl, and other groups susceptible to reactions with DEZ. Studies of a similar ALD reaction for growing $Al_2O_3$ from trimethylaluminum (TMA) and water at 85° C. on polystyrene films show that the organometallic precursor is retained by the near-surface or bulk of the polymer even after the chamber is evacuated of gas-phase precursor. When water enters the reactor in the subsequent step, the retained TMA molecules are free to react inside the polymer film without specificity to the surface. After a significant number of cycles, the PS contains $Al_2O_3$ nanoparticles which seed further linear ALD growth of the films and eventually form conformal layers on top of the PS film. If the DEZ and water ALD reaction nucleates in a similar fashion on PS, then 50 cycles may be a small enough number to avoid surface reactions that protect the PS colloids from chemical dissolution or bind them together in an assembly. The relatively long purge steps in the ALD-ZnO process were also chosen to minimize the inadvertent retention of DEZ in the PS colloids. Discontinuous ZnO nanoparticle deposition was observed in these studies after 500 nm PS spheres were burned out in the host-guest lattice after 50c of ALD-ZnO (FIG. 7a). At higher numbers of ALD cycles (>100), it was observed ALD deposition of ZnO on all diameters of PS colloids. Removal of the organic material was still possible through toluene dissolution or burn-out, leaving behind a shell layer of ZnO that had formed on the surface of the PS spheres.

The hierarchical structure generated in the ALD-ZnO/$SiO_2$ colloidal films is a potentially transformative approach to the fabrication of high-performance photoelectrodes from materials with poor electronic properties. The efficiency of photoelectrochemical energy conversion is determined by the ability of the materials used to maximize light absorption, absorbed photon to carrier collection yield, and the rate at which the depleted local reactant concentrations are replenished by diffusion. Complex architectures for material morphologies and integrated systems that balance these disparate, multiscale processes have been proposed, each relying on time- and energy-intensive fabrication methods. These are robust methods for developing prototypical electrode materials for evaluating the relationship between morphology, system design, and performance. These methods do not necessarily scale well for photoelectrochemical applications such as artificial photosynthesis. Here, a method has been developed for fabricating hierarchically organized materials with continuous control of structure on multiple length scales. More importantly, the structuring can be controlled with a facile, ink-like fabrication process that could be scalable for photoelectrochemical applications. The specific nature in which thin films of nanoscale and microscale colloids and pores can be engineered serves as a platform for integrating the schemes identified through research prototypes.

An example application for this method is the inexpensive fabrication of hierarchically structured hematite ($Fe_2O_3$) photoanodes. In principle, the earth abundance and relatively small band gap (2.2 eV) of the intrinsically n-type $Fe_2O_3$ makes it an attractive material for photoelectrochemical oxidation of water. The absorption length of $Fe_2O_3$ is roughly 120 nm for light with a wavelength of 550 nm. A simple application of Beer's law suggests that a film roughly three times this thickness is required to absorb 95% of the incident illumination. As a result, the holes required to oxidize water are generated deep into the material. $Fe_2O_3$ is a Mott insulator with a minority carrier diffusion length of only 2-4 nm. The difference between these characteristic length scales implies that photogenerated holes in optically thick films are significantly more likely to be lost to recombination rather than to be collected at the interface. Hierarchically structured electrode designs that increase the absorption of light in the volume of $Fe_2O_3$ within a few minority carrier diffusion lengths of a semiconductor-liquid junction can dramatically improve the energy conversion properties of the electrode.

A scalable $Fe_2O_3$ photoelectrode based on the host-guest or knock-out glass architectures are tunable to a number of design parameters, all focused on the multiscale processes of interest. The ALD thin film, potentially composed of conductive Al-doped ZnO or other transparent conducting oxide, can perform as a high-surface area electron-collecting back contact for a thin layer of $Fe_2O_3$. The thickness of the $Fe_2O_3$ layer can be matched with the hole collection length to maximize the internal quantum yield of the electrode. The overall thickness of the underlying $SiO_2$ network of structured colloids ensures that light will pass through many layers of the absorber, increasing the effective optical depth. The diameter for the $SiO_2$ colloids in this network can also be chosen to induce the multiple scattering of light within the plane of the film and further increasing the effective optical depth of the absorber layers. The length scales of porosity required to permit the bulk-like diffusion of reactants through the electrode depends on the concentration of reactants and the reaction rate. The open network of pores generated by removing PS in the electrode structure can be chosen to meet the requirements for unimpeded reactant transport. This ability to selectively preserve and remove functional components of a rationally designed, self-assembled colloidal composite is advantageous for the scalable synthesis of hierarchically structured photoelectrochemical materials.

In conclusion, it has been demonstrated that self-assembled colloidal composites can be used as the basis for hierarchically structured photoelectrodes. The distinct surface chemistries of the colloidal components allow for the selective ALD of ZnO. $SiO_2$ colloids are bound together by a thin deposition of ALD-ZnO while the PS remains accessible to chemical dissolution or thermal burn out. The resulting $SiO_2$ network is mechanically stabilized with tunable porosity, structured on multiple length scales, and conformally coated with a conductive layer of ZnO. This scalable fabrication method can be used to adapt many of the strategies developed to improve photoelectrochemical energy conversion for through rational choice of nanostructured materials.

Various embodiments of the invention have been described in fulfillment of the various objectives of the invention. It should be recognized that these embodiments are merely illustrative of the principles of the present invention. Numerous modifications and adaptations thereof will be readily apparent to those skilled in the art without departing from the spirit and scope of the invention.

The invention claimed is:

1. A photoelectrochemical cell comprising:
a photoelectrode comprising a nanostructured film, the nanostructured film comprising:
a porous inorganic scaffold including particles of electrically insulating inorganic oxide;
an electrically conductive metal oxide coating adhered to the porous inorganic scaffold, wherein the conductive metal oxide coating binds adjacent particles of the insulating inorganic oxide; and
a photosensitive layer deposited over the conductive metal oxide coating.

2. The photoelectrochemical cell of claim 1, wherein the insulating inorganic oxide is radiation transmissive.

3. The photoelectrochemical cell of claim 2, wherein the insulating inorganic oxide is silica, alumina or aluminum oxynitride.

4. The photoelectrochemical cell of claim 1, wherein the conductive metal oxide coating is radiation transmissive.

5. The photoelectrochemical cell of claim 4, wherein the conductive metal oxide is selected from the group consisting of zinc oxide, fluorine doped tin oxide (FTO), indium tin oxide (ITO), gallium indium tin oxide (GITO), aluminum tin oxide (ATO) and zinc indium tin oxide (ZITO).

6. A method of forming a nanostructured layer comprising:
providing a mixture of colloidal polymeric particles and colloidal, electrically insulating inorganic oxide particles;
depositing a conductive metal oxide coating on the colloidal, electrically insulating inorganic oxide particles; and
removing the colloidal polymeric particles to provide a porous inorganic scaffold comprising the colloidal, electrically insulating inorganic oxide particles bound together by the conductive metal oxide coating.

7. The method of claim 6, wherein the inorganic oxide is radiation transmissive.

8. The method of claim 7, wherein the inorganic oxide is silica.

9. The method of claim 7, wherein the conductive metal oxide coating is radiation transmissive.

10. The method of claim 9, wherein the conductive metal oxide is selected from the group consisting of zinc oxide, fluorine doped tin oxide (FTO), indium tin oxide (ITO), gallium indium tin oxide (GITO), aluminum tin oxide (ATO) and zinc indium tin oxide (ZITO).

11. The method of claim 6, wherein the porous inorganic scaffold comprises a uniform pore distribution.

12. The method of claim 6, wherein the porous inorganic scaffold comprises a heterogeneous pore distribution.

13. The method of claim 6, wherein the colloidal polymeric particles are surface functionalized with transition metal oxide nanoparticles.

14. The method of claim 6, wherein colloidal polymeric particles comprise polystyrene.

15. The method of claim 6, wherein the conductive metal oxide coating is deposited by atomic layer deposition.

* * * * *